United States Patent
Nandakumar et al.

(10) Patent No.: US 11,455,452 B2
(45) Date of Patent: Sep. 27, 2022

(54) VARIABLE IMPLANT AND WAFER-LEVEL FEED-FORWARD FOR DOPANT DOSE OPTIMIZATION

(71) Applicant: TEXAS INSTRUMENTS INCORPORATED, Dallas, TX (US)

(72) Inventors: Mahalingam Nandakumar, Richardson, TX (US); Murlidhar Bashyam, Frisco, TX (US); Alwin Tsao, Garland, TX (US); Douglas Newman, Crowley, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/944,890

(22) Filed: Jul. 31, 2020

(65) Prior Publication Data

US 2021/0089694 A1 Mar. 25, 2021

Related U.S. Application Data

(60) Provisional application No. 62/904,461, filed on Sep. 23, 2019.

(51) Int. Cl.
*G06F 30/30* (2020.01)
*G06F 30/367* (2020.01)
*H01L 21/66* (2006.01)
*G06F 30/398* (2020.01)
*G06F 30/392* (2020.01)
(Continued)

(52) U.S. Cl.
CPC .......... *G06F 30/367* (2020.01); *G06F 30/373* (2020.01); *G06F 30/392* (2020.01); *G06F 30/398* (2020.01); *H01L 22/20* (2013.01); *H01L 29/4011* (2019.08); *H01L 29/42364* (2013.01);
(Continued)

(58) Field of Classification Search
CPC .... G06F 30/392; G06F 2119/18; G06F 30/39; G06F 1/10; G06F 2111/20; G06F 30/327; G06F 30/398; G06F 1/20; G06F 2111/04; G06F 30/396; G06F 30/30; G06F 30/367; G06F 30/373; G03F 9/7076; G03F 9/7084; H01L 27/0688; H01L 27/0207; H01L 21/84; H01L 2924/13091; H01L 2224/73265; H01L 2224/73204; H01L 29/66659; H01L 23/49838; H01L 2224/80895; H01L 24/80; H01L 21/28044;
(Continued)

(56) References Cited

U.S. PATENT DOCUMENTS

6,566,204 B1 * 5/2003 Wang ................ H01L 21/82385
257/E29.054
7,063,991 B1 * 6/2006 Zhao .................. G01R 31/2831
257/E21.336
(Continued)

*Primary Examiner* — Binh C Tat
(74) *Attorney, Agent, or Firm* — Andrew R. Ralston; Charles A. Brill; Frank D. Cimino (57) ABSTRACT

The present disclosure provides a method for adjusting implant parameter conditions in semiconductor processing by wafer and by wafer zone using in-line measurements from previous operations and a feed-forward computer model. The feed-forward model is based on a sensitivity map of in-line measured data and its effect of electrical performance. Feed-forward computer models that adjust implant parameters by wafer and by zone improve both wafer-to-wafer and within wafer electrical uniformity in semiconductor devices.

25 Claims, 10 Drawing Sheets

(51) Int. Cl.
*H01L 21/28* (2006.01)
*H01L 29/66* (2006.01)
*H01L 29/423* (2006.01)
*G06F 30/373* (2020.01)

(52) U.S. Cl.
CPC .... *H01L 29/42376* (2013.01); *H01L 29/6659* (2013.01)

(58) Field of Classification Search
CPC . H01L 2224/13099; H01L 2224/13599; H01L 2224/30517; H01L 27/02
USPC ...................................... 716/132–139, 50–56
See application file for complete search history.

(56) References Cited

U.S. PATENT DOCUMENTS

| | | | | |
|---|---|---|---|---|
| 8,294,159 B2* | 10/2012 | Or-Bach | ............... | H01L 27/092 257/74 |
| 8,754,533 B2* | 6/2014 | Or-Bach | ............... | H01L 27/105 257/777 |
| 2010/0244131 A1* | 9/2010 | Bulucea | ............... | H01L 29/7835 257/336 |
| 2010/0244149 A1* | 9/2010 | Bulucea | ............ | H01L 29/66659 257/408 |
| 2010/0244150 A1* | 9/2010 | Bahl | ............... | H01L 21/823807 257/408 |

* cited by examiner

VARIABLE IMPLANT AND WAFER-LEVEL FEED-FORWARD FOR DOPANT DOSE OPTIMIZATION

CROSS-REFERENCE TO RELATED APPLICATIONS

This application claims the benefit of provisional Application Ser. No. 62/904,461, filed Sep. 23, 2019, which is herein incorporated by reference in its entirety.

FIELD

This disclosure relates to the field of semiconductor devices. More particularly, this disclosure relates to ion implant optimization by wafer and by zonal location within a wafer.

BACKGROUND

Semiconductor devices have historically undergone technological advances in materials and designs which have produced generations of semiconductor devices where each succeeding generation contains smaller and more complex circuits than the previous generation. As the critical dimensions (CDs) of the finest features of a semiconductor device become smaller, control of such features becomes more difficult using existing wafer fabrication processing equipment. Lot to lot, wafer-to-wafer, and within wafer control of processing conditions are critical to acceptable semiconductor electrical performance measured during completed semiconductor device wafer acceptance testing (WAT).

SUMMARY

Disclosed embodiments describe a method of fabricating Metal-Oxide Semiconductor (MOS) transistors including fabrication methods for building a wafer-level semiconductor device electrical sensitivity map and a feed-forward computer model based on in-line physical measurements. The sensitivity map and feed-forward computer model allow variation of an implant parameter by lot, by wafer, and by a plurality of zones within a wafer.

To minimize electrical variation in transistor performance in MOS semiconductor device fabrication, the present disclosure describes a method of minimizing wafer-to-wafer and within wafer electrical transistor variation. The first step of the method is to define an electrical transistor sensitivity map based on a sampling of all site WAT, on-chip electrical data, or transistor corner lot data which includes variation in parameters that may affect electrical test variation which correlates the specific gate electrode structure to measurable in-line parameter values. Based on the completed semiconductor device corner lot WAT data, a sensitivity map of the electrical response to various physical measurements can be realized. The sensitivity map is then used to create a feed-forward computer model to allow variation of implant parameters by wafer and by zone within wafer to achieve desired transistor performance and variation.

Additional parameter data may be added to the sensitivity model based on WAT data from recently completed material which can refine the sensitivity model to account for any shift to the sensitivity map model due to processing tool shifts.

DETAILED DESCRIPTION

The present disclosure benefits from the recognition by the inventors that inline physical characteristics related to a polysilicon gate formed over a semiconductor substrate may be used in a feed-forward process to determine parameters of an implant process to reduce the effect of wafer-to-wafer and within wafer variation of the physical characteristic on electrical operating parameters of an electronic device. While described examples may be expected to improve uniformity of electrical performance of devices produced in a particular process flow, no particular result is a requirement of the present invention unless explicitly recited in a particular claim.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

It is noted that terms such as top, bottom, front, back, over, above, under, and below may be used in this disclosure. These terms should not be construed as limiting the position or orientation of a structure or element, but should be used to provide spatial relationship between structures or elements. Similarly, words such as "inward" and "outward" would refer to directions toward and away from, respectively, the geometric center of a device or area and designated parts thereof.

Figure 1:
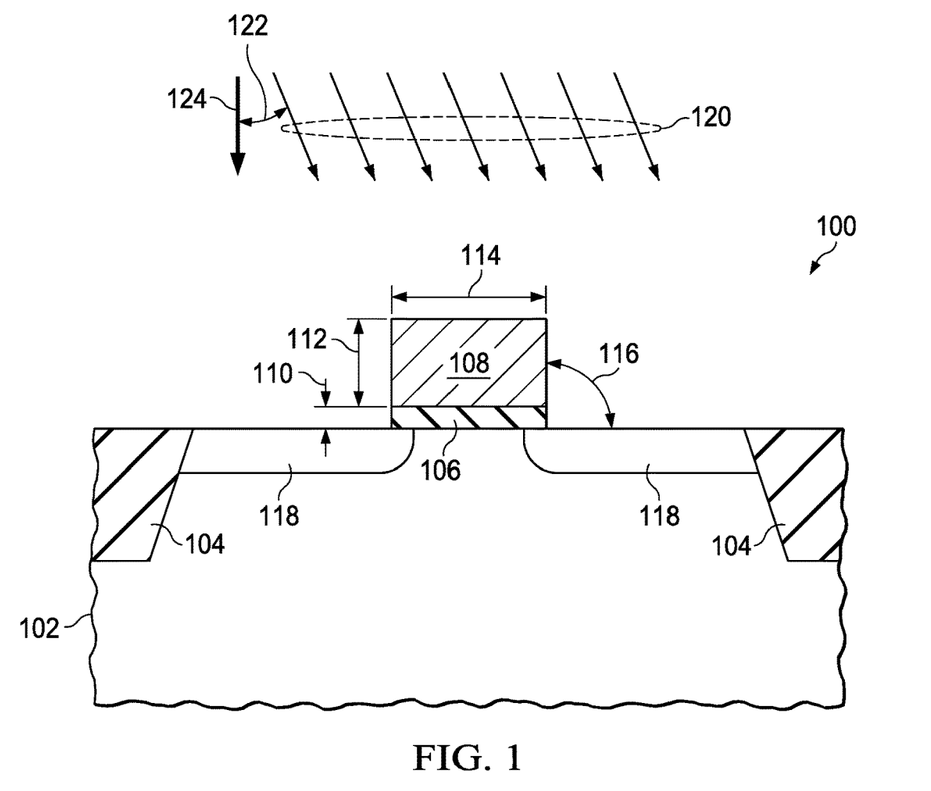
FIG. 1 is a cross section of a portion of a semiconductor device showing a MOS transistor highlighting physical parameters used in a semiconductor device sensitivity map according to an example embodiment.

Referring to FIG. 1, a representation of a MOS transistor 100 is shown at an intermediate stage of formation. Although the MOS transistor 100 is described in terms of a PMOS semiconductor device, the described principles may similarly be applied to the formation of NMOS semiconductor devices when p-doped regions are substituted by n-doped regions, and vice-versa. Herein a p-type region may be referred to as a region of a first conductivity type, and an n-type region may be referred to as a region of a second connectivity type.

FIG. 1 highlights various in-line physical measurement parameters which may be measured as inputs for a feed-forward dopant implant system. The MOS transistor 100 is located in or over a semiconductor substrate 102, which may comprise silicon or any other suitable semiconductor material. MOS transistors include patterned features, and a plurality of the patterned features may be repeated across the substrate 102 to produce multiple copies of the MOS transistor 100. In FIG. 1, the single MOS transistor 100 is isolated on each side by shallow trench isolation (STI) features 104. A gate electrode stack including a gate dielectric layer 106 and a gate electrode 108 is formed over the semiconductor substrate 102. The gate dielectric layer 106 can contain silicon dioxide, silicon oxynitride, or other suitable dielectric material. The gate electrode 108 includes polysilicon in this example but can be of other suitable gate electrode materials, e.g. metallic gate materials. The gate dielectric layer 106 has a thickness 110, and the gate electrode 108 has a thickness 112 and a length 114. A sidewall angle 116 characterizes the angle formed between a sidewall of the gate electrode 108 and the top surface of the substrate 102. Implanted regions 118 extend from corresponding ones of the STI features 104 to and under the gate dielectric 106. The implanted regions 118 may be, e.g. lightly-doped drain (LDD) regions, or halo regions (sometimes referred to a pocket implant regions). The implanted regions 118 are formed by an implant process that implants a suitable dopant into the substrate 102, e.g. arsenic for an NMOS LDD, or boron for an NMOS halo region. The implanted regions 118 may be characterized by a dopant concentration that results from an implant dose received at the surface of the substrate 102. The doped regions 118 a formed in part by a peripheral implant 120, discussed in detail below. The peripheral implant 120 may be characterized in part by an implant species, energy and dose, and by an implant angle 122 relative to a surface normal 124 that is perpendicular to the surface of the substrate 102.

The electrical performance of the transistor 100 may depend on, or be sensitive to, the values of the gate dielectric thickness 110, gate electrode thickness 112, length 114, sidewall angle 116, and implant dose of the regions 118. These values may be collectively referred to as device attributes. A multi-dimensional sensitivity map may be constructed that characterizes or predicts the performance of the transistor 100 as a function of one or more of these device attributes. As used herein, the term "map" refers to an association between a performance attribute of the transistor 100 and one or more of the device attributes, for each of a plurality of locations on a manufacturing workpiece such as a silicon wafer. The multi-dimensional sensitivity map may be manifested as a data structure within a computer, for example a table or matrix.

The multi-dimensional sensitivity map may be determined, or parameterized, by determining a relevant performance parameter of the transistor 100 for various combinations of the device attributes in the context of a design-of-experiments (DOE) protocol. Thus, for example, one or more wafers may be manufactured with intentional variations of the device attributes to determine a performance model that predicts the performance parameter as a function of the values of the device attributes within a range of interest. In a more specific example, when the gate dielectric thickness 110 is included as part of the multi-dimensional sensitivity map DOE, several gate dielectric thicknesses are used, with some wafers near a first gate dielectric thickness, a second electrode dielectric thickness, and near a third gate dielectric thickness (e.g., near a minimum gate dielectric thickness, near a target gate dielectric thickness, and near a maximum gate dielectric thickness allowed by the process). In-line gate dielectric thickness measurements from such a DOE can be used as a measured component of the multi-dimensional sensitivity map. The gate electrode thickness 112, gate length 114, and the sidewall angle 116 may be similarly varied when included in the multi-dimensional sensitivity map.

The device attributes may be, and typically are, subject to random or systematic variation at different locations on production the workpiece. The value of the performance parameter p will thus typically not be the same at all locations on the production workpiece. While a particular device attribute value may be controlled within a range of values, variation within that range is generally not controllable. However, the effect of such variation on the performance parameter p may be reduced by a varying a controllable device parameter, such as the implant dose used to form the implanted regions 118. In the current example, the implant dose may be used as a controllably variable attribute that is varied based on in-line physical measurements of one or more of the other device attributes to minimize variation of the performance parameter p when the transistor 100 is complete. In some cases the performance parameter p may be an end-of-line transistor drive current, but the described methodology is not limited to this performance parameter.

Figure 2:
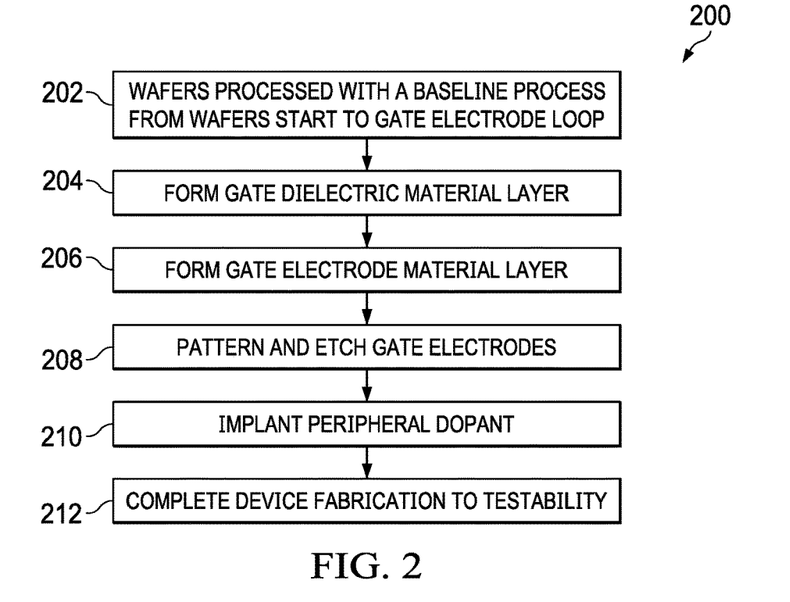
FIG. 2 illustrates an example method of forming an electronic device, e.g. a MOS transistor, including various steps of interest in described methods of reducing variability of electrical performance of such devices.
Figure 3:
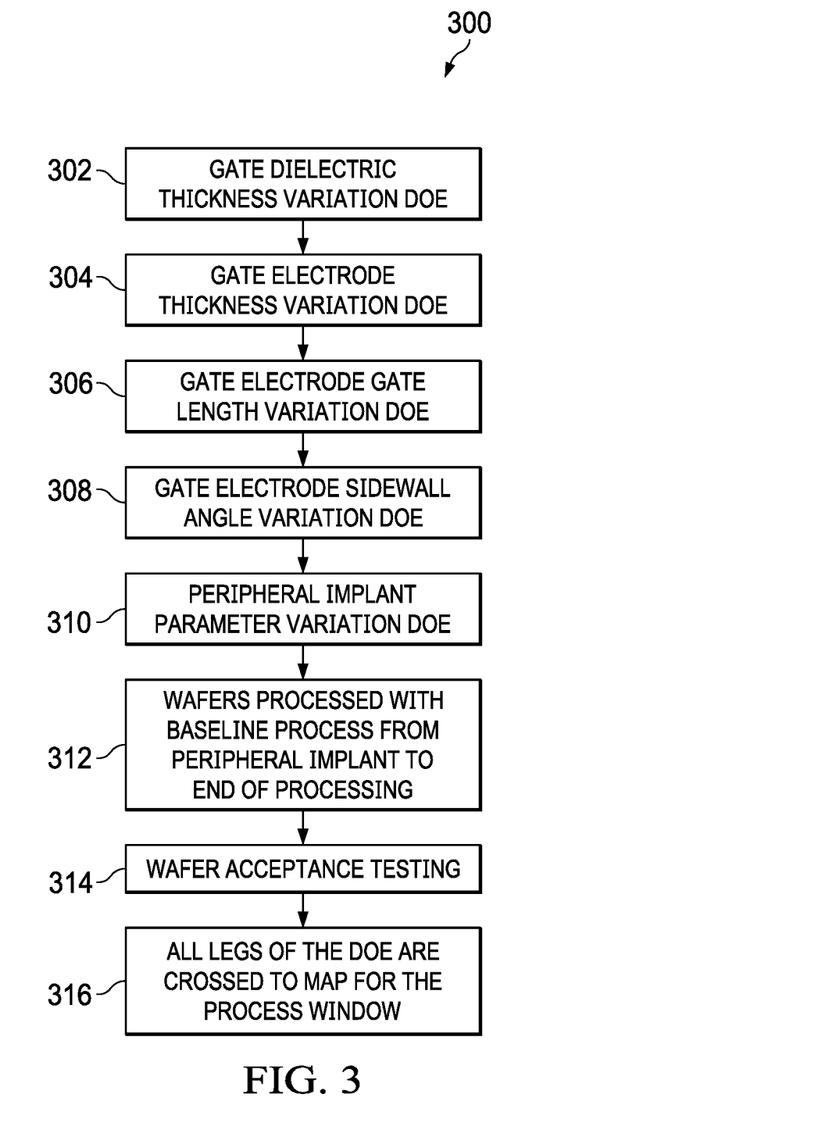
FIG. 3 is an example flow diagram which demonstrates a possible Design of Experiment (DOE) to generate a semiconductor device sensitivity map according to an example embodiment.

FIG. 2 and FIG. 3 are presented and described concurrently. FIG. 2 shows an example method 200 of fabricating a semiconductor device, e.g. the transistor 100, at multiple locations on a substrate. FIG. 3 shows a method, e.g. a flow diagram, 300. The method 300 may be used to generate a multi-dimensional sensitivity map of the impact of a physical characteristic and corresponding gate electrode parameter value on an electrical performance attribute of a completed device such as the transistor 100. It is understood with respect to discussion of FIGS. 2 and 3 that the word "step" is used to denote a stage of the method that may not be limited to a single action or a single point in time, but may include multiple individual actions implemented over an appropriate time span. Gate electrode parameters may include one or more of the in-line measured gate electrode thickness 112, in-line measured gate electrode length 114, in-line gate electrode sidewall angle 116 and an implant parameter value used to form the implanted region 118. Herein, gate electrode length (or simply gate length) refers to the physical distance between a first gate sidewall located over or toward a source region, and a second gate sidewall located over or toward a drain region. Input parameters for the sensitivity map may be determined using the DOE methodology, in which multiple parameters are allowed to vary between input data locations on a test wafer. Thus, for example, lithographic parameters, plasma etch parameters, and/or material deposition parameters may be varied in a DOE matrix at different locations on a substrate (e.g. wafer), and the relevant electrical characteristic(s) determined when the device has completed processing. Inputs for the DOE are made at a plurality of sites for a plurality of gate electrodes on at least one structure in at least one structure location per zone in a plurality of structure locations.

The method 200 begins with a step 202, in which wafers are provided that are processed using a baseline process from wafer start up to formation of a gate dielectric layer. The method 200 advances to a step 204, during which the gate dielectric layer 106 is formed. In a step 302 (FIG. 3), several values of the gate dielectric thickness 110 within a gate dielectric thickness processing range are chosen to represent the variation in gate dielectric thickness seen across multiple processing lots, variation wafer-to-wafer, and variation within wafer. The gate dielectric thicknesses 110 may generally be chosen to be near a first gate dielectric thickness, near a second gate dielectric thickness, and near a third gate dielectric thickness (e.g. a minimum gate dielectric thickness, a target gate dielectric thickness, and a maximum gate dielectric thickness). After the step 202, a DOE model of the gate dielectric thickness 110 based on in-line physical measurement is determined at a plurality of locations on the wafer within each zone on the wafer. Determination of the gate electrode thickness may be by, e.g. ellipsometry. Correlation of in-line measured gate dielectric thickness 110 from the gate dielectric thickness DOE and end-of-line WAT testing are used as inputs for the multi-dimensional sensitivity map.

Referring again to FIG. 2, in a step 206 a gate electrode material layer is deposited on the gate dielectric layer 106. The gate electric material layer will be patterned in a later processing step to produce the gate electrode 108 with the thickness 112. Step 304 in FIG. 3 provides a DOE based on variation of the gate electrode material thickness. In the step 304, each of a number of substrates may be processed using a different nominal value of the gate electrode thickness 112. The nominal values may be selected within a gate electrode thickness processing range to represent the variation in gate electrode thickness 112 seen across multiple processing lots, variation wafer-to-wafer, and variation within wafer. The gate electrode thicknesses may generally be chosen to be near a first gate electrode thickness, near a second gate electrode thickness, and near a third gate electrode thickness (e.g. a minimum gate electrode thickness, a target gate electrode thickness, and a maximum gate electrode thickness). After the step 206, a gate electrode thickness value 112 based on in-line physical measurement is determined at a plurality of locations on the wafer within each zone on the wafer. Determination of the gate electrode thickness 112 may be by, e.g. sheet resistance measurement. Correlation of in-line measured gate electrode thickness from the gate electrode thickness DOE and end-of-line WAT testing are used as inputs for the multi-dimensional sensitivity map.

The method 200 advances to a step 208, during which gate electrode patterning and etching are performed to produce the gate electrode 108. FIG. 3 provides one or more steps that implement DOEs that may characterize the resulting gate electrodes 108 as a function of various dimensional attributes. In a first such step 306, each of a number of substrates may be processed using a different nominal plasma etch condition. Several gate electrode lengths 114 may be chosen within a gate electrode length processing range to represent the variation in the gate electrode length 114 seen across multiple processing lots, variation wafer-to-wafer, and variation within wafer. The gate electrode length targets may generally be chosen to be near a first gate electrode length, near a second gate electrode length, and near a third gate electrode length (e.g. a minimum gate electrode length, a target gate electrode length, and a maximum gate electrode length for the process). The processing step to manipulate the gate electrode length 114 can be done either by choosing different critical dimension (CD) targets at the gate electrode photolithography processing step or choosing different targets at the gate electrode etch processing step. After forming the gate electrodes, a gate electrode parameter value is determined for at least one gate electrode in each implant zone based on the physical characteristics of each gate electrode. In one example, the gate electrode length 114 based on in-line physical measurement is determined at a plurality of locations on the wafer within each zone of the wafer. The gate electrode length 114 may be measured at any desired distance above the substrate 102, e.g. one or more positions selected from the group consisting of a bottom of the gate electrode, a middle of the gate electrode, and a top of the gate electrode.

In a step 308, a gate sidewall angle DOE may be implemented using several values of the gate electrode sidewall angle 116 near a first gate electrode sidewall angle, a second gate electrode sidewall angle, and a third gate electrode sidewall angle within a gate electrode sidewall angle processing range used to represent the variation in gate electrode sidewall angle seen across multiple processing lots, variation wafer-to-wafer, and variation within wafer. For example, such sidewall angles may be, e.g., near a minimum gate sidewall angle, a target gate sidewall angle, and a maximum gate sidewall angle. The gate electrode sidewall angle 116 may be based on in-line physical measurement determined at a plurality of locations on the wafer in each zone of the wafer.

After the step 306 and/or step 308 are/is performed, the wafers may then be processed with a same process, e.g. a baseline process, up to a step 210 (FIG. 2.) at which a peripheral dopant implant is performed. As used herein a "peripheral dopant" is a dopant implanted adjacent (e.g. at the periphery of) the gate electrode 108 with a different dopant characteristic than subsequently used to form source and drain regions (not shown in FIG. 1). The peripheral dopant may be implanted with a different energy, dose, dopant type and/or angle 122 (FIG. 1). Examples such of peripheral dopant implants include halo implants and lightly-doped drain (LDD) implants. Peripheral dopant implants may be used to modify the operating characteristics of a MOS transistor by tailoring dopant profiles to alter drive currents, reduce hot electron effects and/or short channel effects.

At the step 210, a peripheral implant DOE is implemented at a step 310 (FIG. 3) using several implant conditions, e.g. implant doses. The peripheral implant DOE is implemented to represent variation in peripheral implant parameter values as seen across multiple processing lots, variation wafer-to-wafer, and variation within wafer. The peripheral implant dopant doses are generally chosen near a first peripheral implant dose, a second peripheral implant dose, and a third peripheral implant dose of the process. For example the first, second and third implant doses may correspond to a minimum implant dose, a target implant dose, and a maximum implant dose allowed within the process technology used to form the transistor 100. To fully characterize the process window for the DOE of the corresponding gate electrode parameters and peripheral implant doses at all process window corners, the DOE of wafer variation of gate electrode parameters for gate electrode thickness 110, gate electrode length 114, gate electrode sidewall angle, 116 and the implant parameter value for the peripheral implant 120 can be crossed using a full DOE methodology 316 to generate a full multi-dimensional sensitivity map. The DOE can include a high drive current corner (thin polysilicon, low sidewall angle, short gate length), a low drive current corner (thick polysilicon, high sidewall angle, long gate length), and legs with a minimum and maximum of each parameter, with all other parameters being held at their nominal values.

Without implied limitation, the methodology described herein is expected to be particularly beneficial when applied to halo implants. (Come up with some good verbiage here, possibly with Nandu's input.)

After the step 210, the wafers may be are processed at a step 212 using the baseline process to any desired processing step at which the completed electronic devices may be electrically characterized.

At a wafer acceptance testing step 314, wafers from each leg of the DOE are tested at a plurality of electrical sites in each zone of the wafer to generate the multi-dimensional electrical sensitivity map of in-line measurement of gate electrode thickness, gate electrode length, gate electrode sidewall angle, and halo implant.

The DOE models obtained in the described method steps are advantageously applied to a feed-forward production system in which inline measurements of the gate dielectric thickness 110, gate electrode thickness 112, gate electrode width 114 and sidewall angle 116 may be used to select one or more parameters of the peripheral implant 120. In this manner, manufacturing variations such a cross-wafer nonuniformity and/or wafer-to-wafer nonuniformity may be compensated by the peripheral implant 120 to reduce such variability within one or more production lots.

Figure 4:
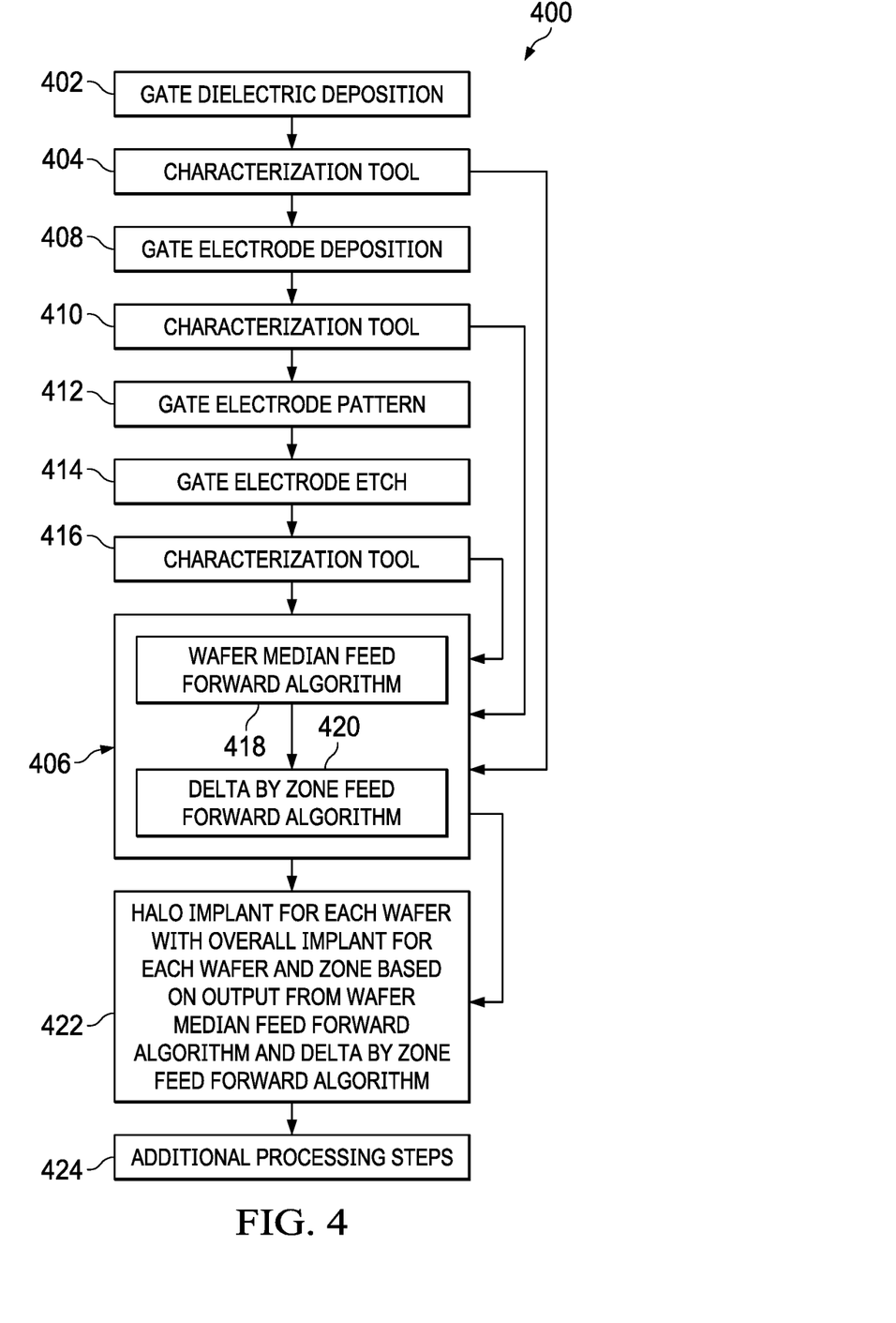
FIG. 4 is an example process flow diagram which illustrates example process steps and information flow that implement a wafer zonal implant process using by-wafer median feed-forward and by-wafer delta to median zonal feed-forward processing.

Referring to FIG. 4, a manufacturing process 400 is shown that illustrates processing of a semiconductor substrate, e.g. a wafer, and information flow of the by-zone halo implant feed-forward method in one example. In the figure, solid lines show progress of a wafer in the process sequence, while dashed lines indicate information flow between various components of the process sequence. In a deposition tool 402 a gate dielectric layer is formed over the substrate. The thickness of the gate dielectric layer is determined by a characterization tool 404, e.g. an appropriately configured scatterometer. The gate dielectric thickness data acquired by the characterization tool 404 is forwarded to a feed-forward processor 406. In a deposition tool 408 a gate electrode layer, e.g. polysilicon, is formed over the substrate. After the gate electrode layer is formed on the wafer the gate electrode thickness is determined by a characterization tool 410, e.g. by four-point resistance measurement. The gate electrode thickness data are also forwarded to the feed-forward processor 406. After the gate electrode layer thickness measurement, a photoresist layer over the gate electrode layer is patterned at a pattern process 412 and etched at an etch tool 414. After etching the gate electrodes, the gate electrode length and sidewall angle are measured by a characterization tool 416, e.g. a scatterometer, and the gate electrode length information is passed to the feed-forward processor 406.

The feed forward processor 406 includes a wafer median value feed-forward algorithm 418 that calculates the by wafer median halo implant dose using the gate dielectric thickness, the gate electrode thickness, the gate length and the gate sidewall angle. The wafer median halo implant dose is calculated for each wafer to achieve a desired electrical uniformity of semiconductor devices based on the gate dielectric thickness, the gate electrode thickness, the gate length and the gate sidewall angle. Once the wafer median value feed-forward algorithm 418 calculates the wafer median halo implant dose, a delta by zone feed-forward algorithm 420 uses this value as well as the gate dielectric thickness, the gate electrode thickness, the gate length and the gate sidewall angle to determine a by zone halo implant delta dose for various implant zones of the wafer. The output of the delta by zone feed-forward algorithm 420 may serve as the output of the feed-forward processor 406, which is directed to a wafer implant tool 422 where the appropriate halo implant by zone is implanted to achieve the desired electrical uniformity of semiconductor devices for each zone of the wafer. In a step 424, a number of additional process steps may be performed to complete processing of the wafer after the implant tool 422. The described method may be repeated for each wafer in a production lot of wafers.

The feed-forward processor 406 may be implemented in a special purpose processing system, e.g. a computer, or in another processing system adapted to implement the described algorithms. For example, without implied limitation, the feed-forward processor 406 may be a computing system connected to the implant tool 422 to support implant functions of the implant tool 422. The algorithms 418 and 420 may be defined by machine-readable instructions that may be executed by the feed-forward processor 406. Such instructions may be stored on a non-transitory machine-readable storage medium such as a magnetic disk or flash memory (e.g. thumb drive), or may be transferred to the feed-forward processor 406 via a wired or wireless network connection for immediate or delayed execution. The instructions may configure one or more processors, e.g. central processing units (CPUs) to execute the components of the algorithm, e.g. adding, subtracting, multiplying and dividing, storing intermediate and final computational results, and transferring parameters to the implant tool 422 needed to implement a desired implant pattern on a wafer-level substrate.

Figure 5:
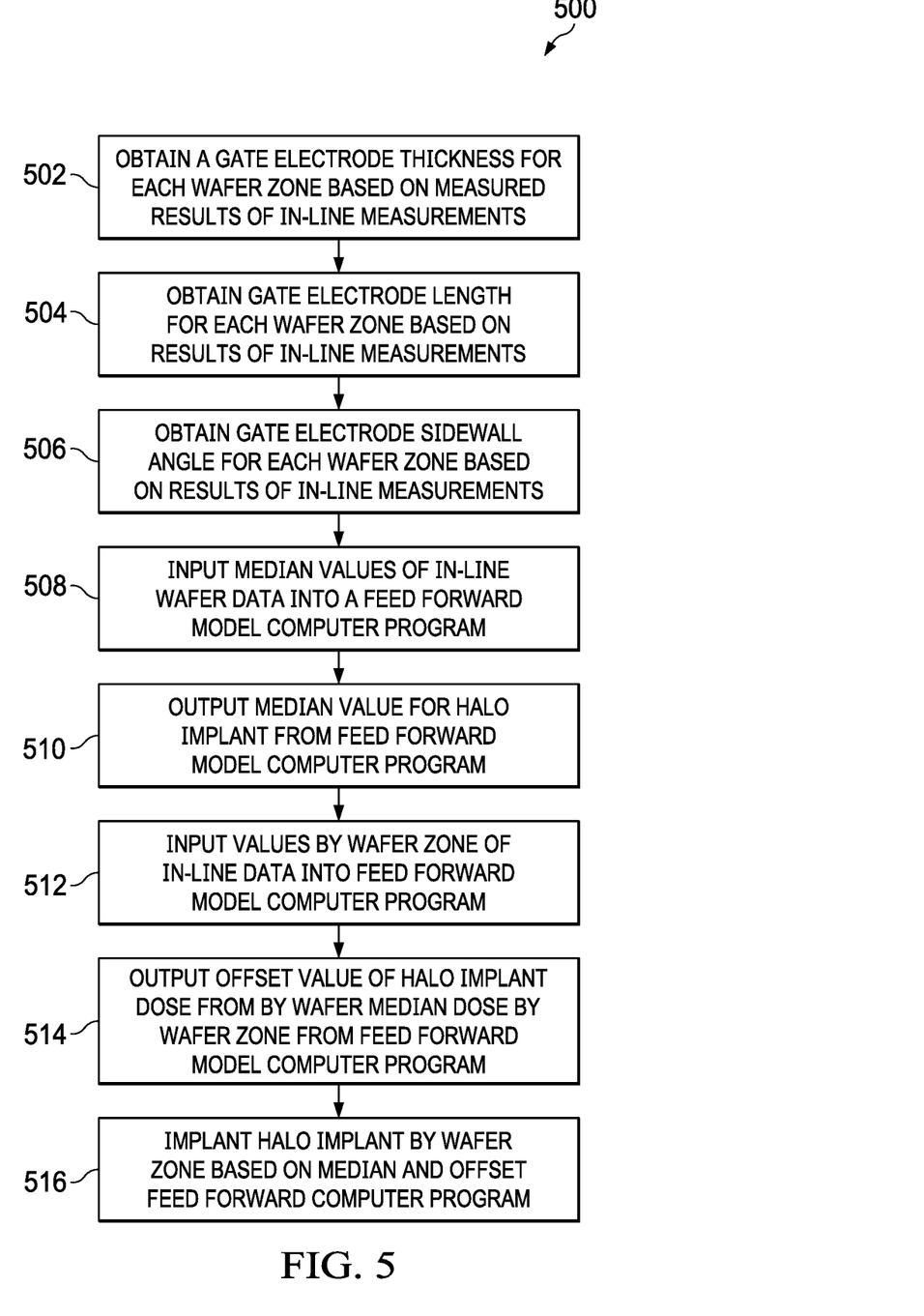
FIG. 5 is an example flow diagram which demonstrates how a computer feed-forward program is used to take in-line data as input to generate by wafer and by zone specific implant parameter outputs to improve wafer-to-wafer and within wafer electrical uniformity of semiconductor devices.

FIG. 5 illustrates an example feed-forward computer program flow diagram 500 that shows steps in an example method of a feed-forward computer program process to improve wafer-to-wafer and within wafer variation of a MOS transistor. For the feed-forward computer program model, a gate electrode parameter is measured for at least one gate electrode with the corresponding parameter value to in-line measurements. In one embodiment, the gate electrode thickness measurement 502 is based on a plurality of gate electrode sites within each implant zone. After the gate electrode formation process, a measurement is taken to determine a gate electrode length 504 at a plurality of gate electrode sites within each implant zone and similar measurements are made at a plurality of gate electrode sites within each zone to determine the gate electrode sidewall angle 506. Wafer median values of a gate electrode thickness measurement 502, a gate electrode length measurement, 504 and a gate electrode sidewall angle measurement 506 from each wafer are used as inputs 508 for a feed-forward computer program model which outputs 510 a wafer median value halo implant dose necessary for each wafer to achieve an electrical parameter of the semiconductor device which is desired for each wafer. The values of gate electrode thickness 502, gate electrode length 504, and gate electrode sidewall angle 506 for each of a plurality of measured zones based on at least one measurement location per zone are used as the input into a feed-forward computer program 512. The feed-forward computer program for a by zone halo implant then outputs a halo implant dose offset value 514 from the wafer median halo implant dose generated in step 510 for the halo implant dose necessary for each of the plurality of implant zones. The output of the median value halo implant by wafer 510 and the halo implant dose offset by zone 514 are then combined to determine a final halo implant dose 516 which is then implanted into each wafer to achieve minimum variation of drive current by wafer zone. In at least one embodiment, a predetermined correlation that relates electrical performance of a device including the gate electrode to the gate electrode thickness, the gate electrode length, and the gate electrode sidewall angle is used to determine the halo implant dose and allows a smaller number of measurements to be made to determine the halo implant dose necessary by wafer and by zone.

Figure 6A:
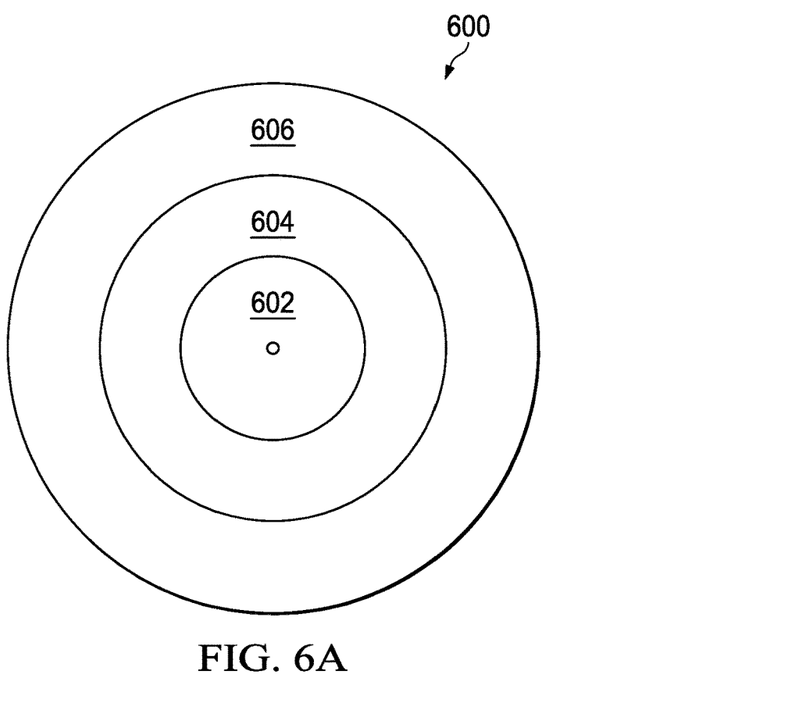
FIGS. 6A-6D include possible implant wafer maps according to an example embodiment.
Figure 6B:
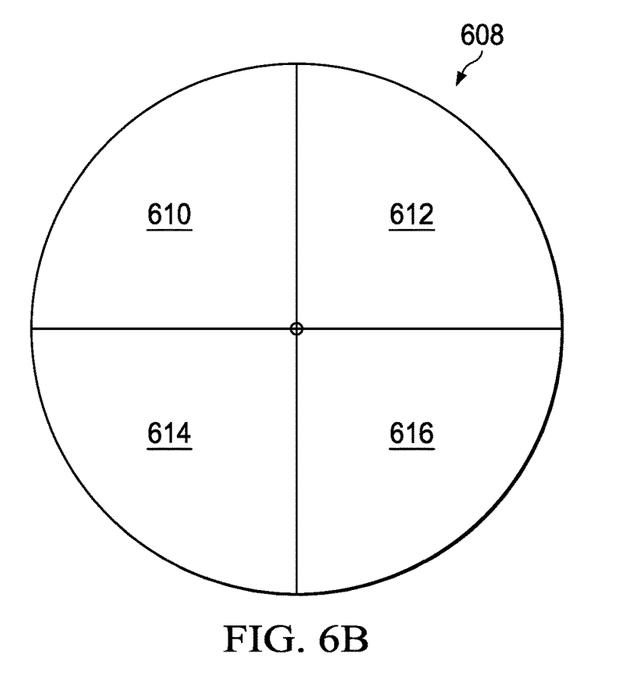
Figure 6C:
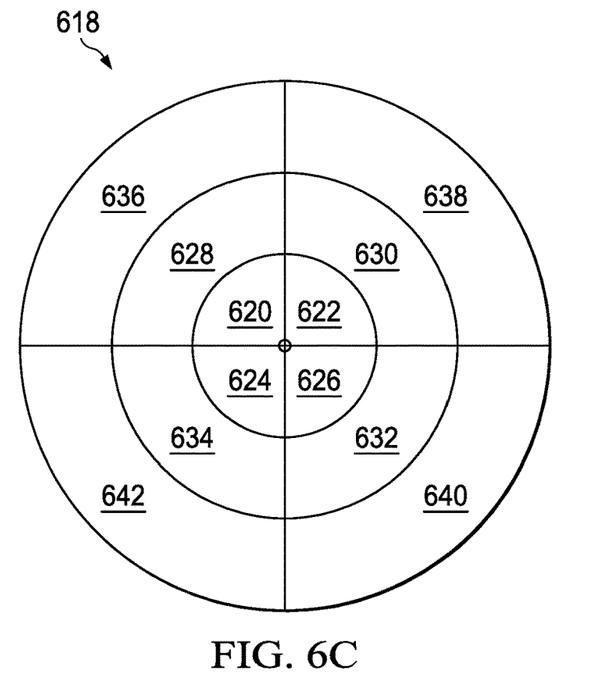
Figure 6D:
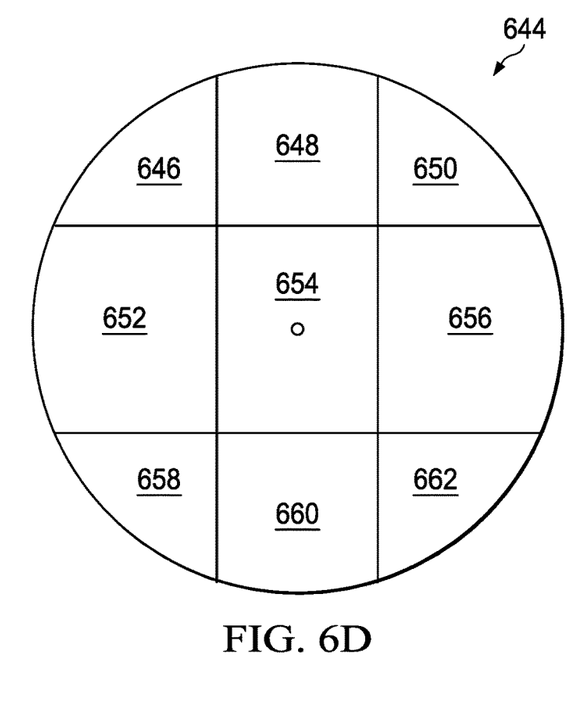

Referring to FIG. 6A-6D, several examples of zonal maps that may be used for across wafer halo implant variations are shown. FIG. 6A shows an example zonal map 500. The zonal map shown in FIG. 6A includes a set of annular rings. The annular rings consist of three concentric zones with a center zone 602, a middle zone 604, and an outer zone 606. While FIG. 6A demonstrates one example of a zonal map, zonal maps with more concentric rings are possible depending on the capabilities of an implant tool used for the halo implant. FIG. 6B shows an example quadrant map 608. The quadrant map consists of four zones in the given example, 610, 612, 614, and 616. An implant map using annular quadrant zones 618 is shown in FIG. 6C and includes three concentric rings which are further divided into quadrants. The center zone contains four regions 620, 622, 624, and 626, the middle ring with four regions 628, 630, 632, and 634, and an outer ring consists of four regions 636, 638, 640, and 642. While FIG. 6C is an example of an annular zonal map 618, annular zonal maps with more radial zones are possible depending on the capabilities of halo implanter processing capability. Referring to FIG. 6D, an example of a checkerboard pattern 644 type zonal map is shown. The map consists of an upper row encompassing zones 646, 648 and 650, a center row encompassing zones 652, 654, and 656, and a lower row encompassing zones 658, 660, and 662 by way of example. While FIG. 6D is an example of a checkerboard pattern type zonal map, checkerboard pattern zonal maps with more rows and columns are possible depending on the capabilities of halo implanter processing capability.

Figure 7:
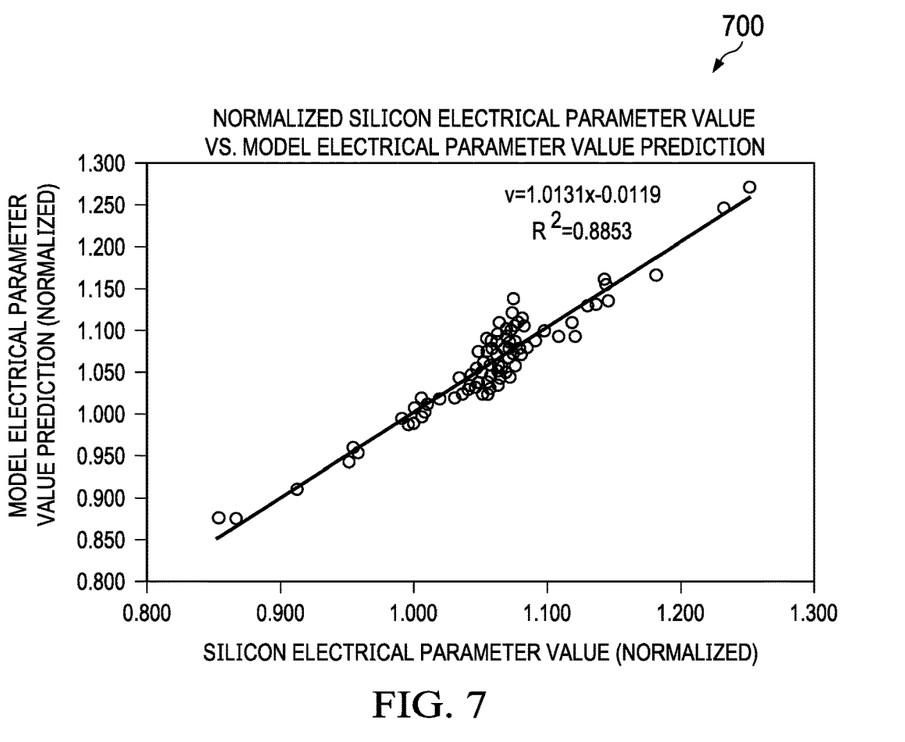
FIG. 7 describes the correlation between a normalized projected values of an electrical parameter due to variation in gate dielectric thickness, gate electrode length, and gate electrode sidewall angle and values based on experimental data.

Referring to FIG. 7, a correlation plot 700 is presented without implied limitation demonstrating correlation between normalized measured values of a transistor electrical parameter, e.g. Idrive per unit length, and normalized predicted values of the electrical parameter. The measured transistors were formed using the described feed-forward method, and the predicted values were determined as a function of measured gate dielectric thickness 112, gate electrode length 114, and gate electrode sidewall angle 116 as previously described. The linear fit of predicted values to measured values has a $R^2$ value of 0.885, demonstrating that the performance of transistors formed using the described feed-forward method may be accurately predicted. This result indicates the described feed-forward method using median forward and zonal granularity results achieving target electrical transistor parameters with high accuracy, desirably reducing within-wafer and wafer-to-wafer variability of transistor performance.

Figure 8A:
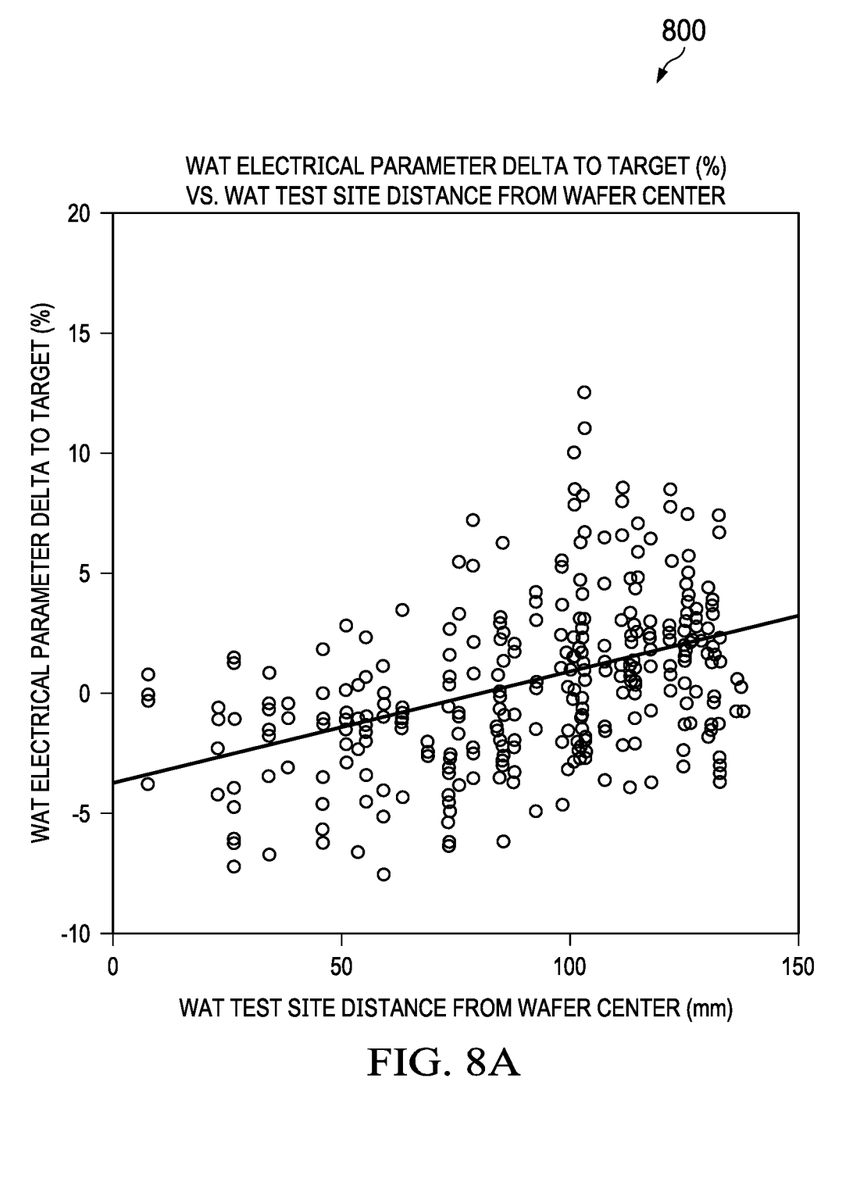
FIG. 8A-8B describes the electrical parameter value (%) delta to target vs. wafer radius using a wafer median feed-forward computer model compared to the electrical parameter value (%) delta to target vs. wafer radius using a median feed-forward computer model and a by zone delta to median feed-forward computer model.
Figure 8B:
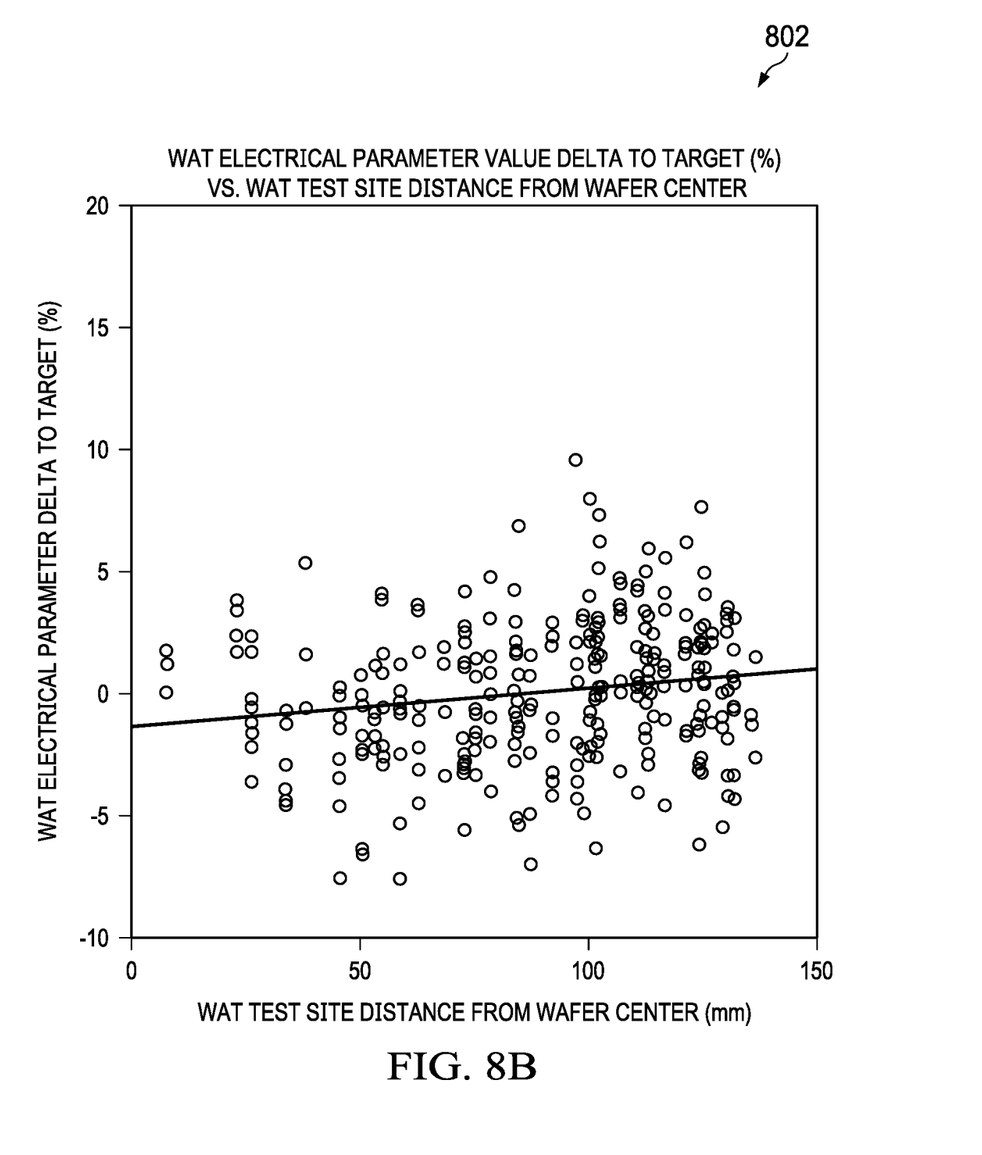

Referring to FIG. 8A and FIG. 8B, percent deviation ("delta to target") versus distance from wafer center is shown for measured values of a transistor electrical parameter, e.g. Idrive, for two conditions. FIG. 8A illustrates a plot of normalized Idrive delta to target (%) data for a population of transistors formed on wafers processed using the wafer median value feed-forward algorithm 418 without the delta by zone feed-forward algorithm 420 to determine halo implants for the transistors. The wafer median value feed-forward algorithm adjusts the halo implant dose across the entire wafer based on median values of gate dielectric thickness 112, gate electrode length 114, and gate electrode sidewall angle 116, and results in about a 6% increase of a linear best fit to the data from the wafer center to the wafer edge. FIG. 8B illustrates a plot of normalized Idrive WAT delta to target (%) data plotted verses the distance from the wafer center for the case that both the wafer median value feed-forward algorithm 418 and the delta by zone feed-forward algorithm 420 are used to generate a by zone halo implant dose by the implanter 422. By applying both the by wafer median value feed-forward algorithm 418 and the delta by zone feed-forward algorithm 420 to generate a halo implant map by zone, the center to edge variation of the WAT electrical parameter values were reduced to approximately 2.5% across-wafer, a reduction of almost 60% of the cross-wafer variability compared to using the median by wafer median value feed forward algorithm 418 only.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

EXAMPLES

Disclosed examples are further illustrated by the following example, which should not be construed as limiting the scope or content of this disclosure in any way. The example demonstrates a general methodology for developing a sensitivity response curve for gate dielectric thickness 106, gate electrode thickness 112, gate electrode length 114, and gate electrode sidewall angle 116. While the example uses three parameters, the model may include any number of parameters which can be measured in line and have a response curve on an end of line electrical response based on in-line measurements. The example also discusses how the sensitivity curve is used to adjust the median halo dose for a wafer and how to adjust the halo implant for a zone on a wafer.

A DOE is conducted that produces transistors using process set points, including a target value and upper and lower limit values, for each of a desired number of process parameters. In the current example, gate electrode thickness, gate electrode length and gate electrode sidewall angle are used without implied limitation. The transistors are processed to a point at which an end of line (EOL) parameter can be characterized, e.g. the drive current, $I_D$. The EOL parameter is determined for transistors at each of the process set points for each of the process parameters. If desired, multiple transistors may be characterized for each combination of process set points, and a mean or median value may be used. Using the DOE protocol, a full factorial design may be used, in which transistors are produced using all combinations of process set points, or a fractional factorial design, in which selected combinations of process set point are used. The DOE may be constructed to determine first order effects for each process parameter, which do not include interactions of the process parameters, and optionally may include higher-order effects, such as interactions between two or more process parameters. A computed parameter, such as slope of a linear best fit, may be determined for each first order or high-order effect, and the computed parameters may be used to determine the feed forward model.

Figure 9A:
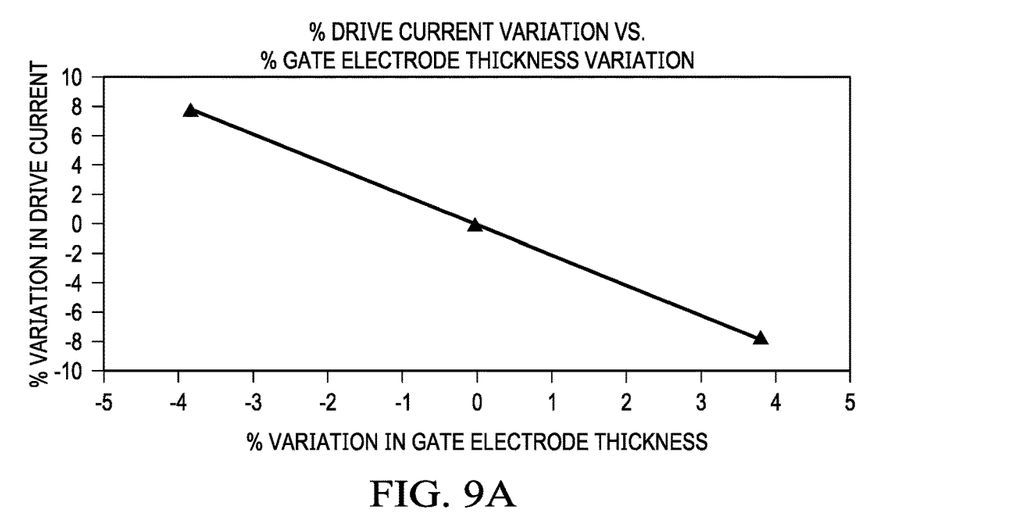
FIG. 9A-9C show example plots of drive current variation over corresponding process variation ranges for three example process parameters in a nonlimiting example of the disclosure.
Figure 9B:
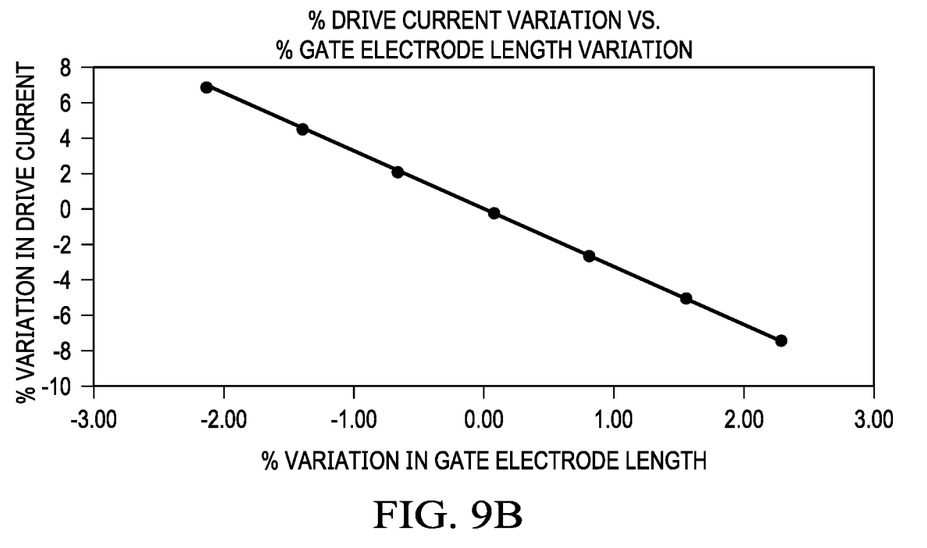
Figure 9C:
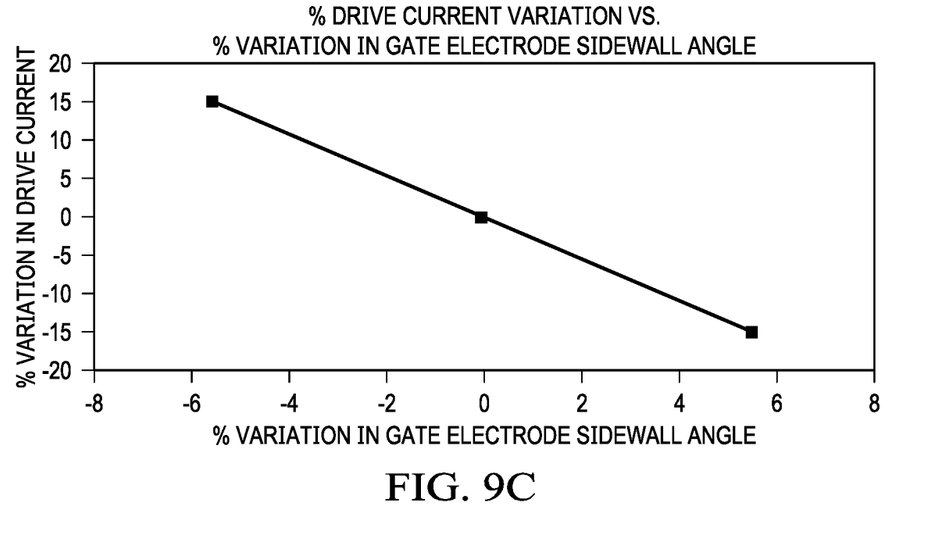

FIG. 9A-9C present example plots of end of line drive current, $I_D$, for three process parameters, in-line measured gate electrode thickness, in-line measured gate electrode length, and in-line measured gate electrode sidewall angle. These data may be used to determine a feed forward model using first order effects of these process parameters.

FIG. 9A illustrates the correlation between in-line measured gate electrode thickness on end of line drive current, $I_D$. In the DOE, wafers are generated with a gate electrode thickness near the lower process limit, near the targeted gate electrode thickness, and near the upper process limit for gate electrode thickness. A best fit line is generated based on the in-line and end of line data and is used in the wafer feed forward algorithm 418 and the delta by zone feed forward algorithm 420 to predicted an effect on end of line drive current for any in-line measured gate electrode thickness within the gate electrode thickness processing window. The sensitivity of $I_D$ to the variation of gate electrode thickness may be expressed by the slope of the best fit line in FIG. 9A, expressed as $A_1$.

FIG. 9B illustrates the correlation between in-line measured gate electrode length on end of $I_D$. In the DOE, wafers are generated with a gate electrode length near the lower process limit, near the targeted gate electrode length, and near the upper process limit for gate electrode length. A best fit line is generated based on the in-line and end of line data and is used in the wafer feed forward algorithm 418 and the delta by zone feed forward algorithm 420 to predicted an effect on end of line drive current for any in-line measured gate electrode length within the gate electrode length processing window. The sensitivity of $I_D$ to the variation of end of line gate electrode length may be expressed by the slope of the best fit line in FIG. 9B, expressed as $A_2$.

FIG. 9C illustrates the correlation between in-line measured gate electrode sidewall angle on end of line $I_D$. In the DOE, wafers are generated with a gate electrode sidewall angle near the lower process limit, near the targeted gate electrode sidewall angle, and near the upper process limit for gate electrode sidewall angle. A best fit line is generated based on the in-line and end of line data and is used in the wafer feed forward algorithm 418 and the delta by zone feed forward algorithm 420 to predicted an effect on end of line drive current for any in-line measured gate electrode sidewall angle within the gate electrode sidewall angle processing window. The sensitivity of $I_D$ to the variation of end of line gate electrode sidewall angle may be expressed by the slope of the best fit line in FIG. 9C, expressed as $A_3$.

The data from the sensitivity curves represented in FIG. 9A-9C are then used in the wafer median feed forward algorithm 418 and the delta by zone feed forward algorithm 420 to calculate and generate an output by wafer zone for the halo implant 422 based on input data from the gate dielectric measurement characterization tool 404, the gate electrode thickness characterization tool 410, and the gate electrode length and sidewall angle characterization tool 416. The algorithm for the wafer median halo implant algorithm 418 is given by;

$$X_m = +A_1 f_1 + A_2 f_2 + A_3 f_3$$

where $X_m$=median halo dose, $A_1$=μA/μm sensitivity of gate electrode thickness, $f_1$=wafer median delta from target of gate electrode thickness, $A_2$=μA/μm sensitivity of gate electrode length, $f_2$=wafer median delta from target of gate electrode length, $A_3$=μA/μm sensitivity of gate electrode sidewall angle, and $f_3$=wafer median delta from target of gate electrode sidewall angle.

The delta halo dose $X_{dn}$ from the wafer median value for each zone n is given by;

$$X_{dn} = A_1 f_{1n} + A_2 f_n + A_3 f_n$$

where $f_{n1}$=delta gate electrode thickness from the wafer median $f_1$ value for gate dielectric thickness for zone n, $A_2$=μA/μm sensitivity of gate electrode length, $f_{2n}$=delta gate electrode length from the wafer median value of gate electrode length for zone n, $A_3$=μA/μm sensitivity of gate electrode sidewall angle, and $f_{3n}$=delta gate electrode sidewall angle from the wafer median value of gate electrode sidewall angle for zone n. The value of n runs from zone 1 to the number of zones in a particular wafer zonal map.

Combining the two equations, the appropriate halo dose for any zone n is given by;

$$X_n = X_m + X_{dn}$$

Where $X_n$=the applied halo dose for zone n, $X_m$=the halo dose based on the wafer median data, and $X_{dn}$ is the delta halo dose for zone n.

Many other examples are possible within the scope of the claimed invention, and further additions, substitutions, and modifications may be made to the described example without departing from the scope of the disclosure.

What is claimed is:

1. A method of forming a semiconductor device, comprising:
   providing a device substrate, the device substrate extending across a plurality of implant zones;
   forming a plurality of gate electrodes over the device substrate, wherein at least one of the gate electrodes is located in each implant zone;
   measuring a physical characteristic of each of the gate electrodes to provide a gate electrode parameter value corresponding to each implant zone;
   determining an implant parameter value for each implant zone based on the gate electrode parameter value corresponding to that implant zone; and
   implanting a dopant into each implant zone using the implant parameter value determined for that implant zone.

2. The method of claim 1, wherein:
   the implant parameter value is a halo implant dose; and
   determining the implant parameter value includes using a sensitivity map that relates electrical performance of a semiconductor device including the gate electrode to the physical characteristic and the halo implant dose.

3. The method of claim 1, wherein:
   the implant parameter value is a halo implant dose; and
   determining the value of the halo implant dose includes using a feed-forward computer program that computes the value of the halo implant dose based on electrical performance of a semiconductor device that includes a gate electrode having the gate electrode parameter value.

4. The method of claim 1 wherein the implant zones include a set of annular rings, a checkerboard pattern, or a center zone coupled with annular quadrant zones.

5. A method of forming a semiconductor device, comprising:

providing a device substrate, the device substrate extending across a plurality of implant zones;

forming a plurality of gate electrodes over the device substrate, wherein each of the gate electrodes is located in a respective one of the implant zones;

measuring a gate electrode parameter of each of the gate electrodes based on a physical characteristic of that gate electrode to provide a gate electrode parameter value corresponding to each implant zone;

determining an implant parameter value for each implant zone based on the corresponding gate electrode parameter values;

implanting a dopant into each implant zone using the implant parameter value.

6. The method of claim 5, wherein:

the implant parameter value is a halo implant dose; and determining the implant parameter value includes using a sensitivity map that relates electrical performance of a transistor including the gate electrode to the gate electrode parameter and the halo implant dose.

7. The method of claim 5 wherein:

the implant parameter value is an LDD implant dose; and determining the implant parameter value includes using a feed-forward computer program that relates an electrical parameter of the semiconductor device to the gate electrode parameter and the LDD implant dose.

8. The method of claim 5 wherein the implant zones include of a set of annular rings, a checkerboard pattern, or a center zone coupled with annular quadrant zones.

9. A method of forming a semiconductor device, comprising:

providing a device substrate, the device substrate extending across a plurality of implant zones;

forming a plurality of locations of a gate electrode over the device substrate, wherein each implant zone includes a corresponding one of the gate electrodes;

for each gate electrode, measuring a thickness value, a gate electrode length value, and a gate electrode sidewall angle value; and determining a halo implant dose for each implant zone using the gate electrode thickness values, the gate electrode length values, and the gate electrode sidewall angle values;

implanting a dopant into each implant zone at the halo implant dose that was determined for that implant zone.

10. The method of claim 9, wherein determining the halo implant dose for each implant zone includes using a predetermined correlation that relates electrical performance of a device including the gate electrode to the gate electrode thickness value, the gate electrode length, the gate electrode sidewall angle value, and the halo implant dose.

11. The method of claim 10, wherein the predetermined correlation further relates the electrical performance to a gate dielectric thickness corresponding to each gate electrode.

12. The method of claim 9, wherein determining the halo implant dose for each implant zone includes using a feed-forward computer program based on a multi-dimensional sensitivity map that relates electrical performance of the semiconductor device to the gate electrode thickness value, the gate electrode length value, and the gate electrode sidewall angle value of that implant zone.

13. The method of claim 9, wherein determining the halo implant dose for each implant zone includes using a feed-forward computer program based on a multi-dimensional sensitivity map that relates electrical performance of the semiconductor device to a wafer median value of the gate electrode thickness values, a wafer median value of the gate electrode length values, and a wafer median value of the gate electrode sidewall angle values.

14. The method of claim 13, wherein determining the halo implant dose for each implant zone includes using a feed-forward computer program to provide a halo implant dose offset for each implant zone from a wafer median value of the halo implant dose obtained from the wafer median value of the gate electrode thickness values, the wafer median value of the gate electrode length values, and the wafer median value of the gate electrode sidewall angle values.

15. The method of claim 9, wherein determining the halo implant dose for each implant zone includes using a parameter that is characteristic of an implant tool used for implanting the dopants into the device substrate.

16. The method of claim 9, wherein the implant zones include annular rings, a checkerboard pattern, or a center zone coupled with annular quadrant zones.

17. The method of claim 9, wherein determining the halo implant dose for each implant zone includes using a feed-forward computer program using a multi-dimensional sensitivity map that correlates drive current of a transistor having a specific gate electrode structure to the gate electrode thickness, gate electrode length, gate electrode sidewall angle, and the halo implant dose.

18. A method of forming a semiconductor device, comprising:

providing a device substrate, the device substrate extending across a plurality of implant zones;

forming a plurality of patterned features over the device substrate, wherein at least one of the patterned features is located in each implant zone;

measuring a parameter of each patterned feature based on a physical characteristic of that patterned feature to provide a parameter value corresponding to each implant zone;

implanting a dopant into each implant zone based on the corresponding parameter value.

19. The method of claim 18, wherein the patterned features include gate electrodes.

20. The method of claim 18, wherein the implanting includes a halo implant.

21. A method of forming a semiconductor device, comprising:

providing a device substrate, the device substrate extending across a plurality of implant zones, each implant zone corresponding to one or more separate die locations each containing an instance of the semiconductor device;

forming a plurality of gate electrodes over the device substrate, wherein at least one of the gate electrodes is located in each die location;

measuring a physical characteristic of each gate electrode to provide a gate electrode parameter value corresponding to each implant zone;

determining an implant parameter value for each implant zone based on the gate electrode parameter value corresponding to that implant zone; and implanting a dopant into each die location using the implant parameter value determined for that implant zone.

22. A method of forming a semiconductor device, comprising: providing a semiconductor substrate forming a plurality of gate electrodes over a semiconductor substrate;

measuring a physical characteristic of the plurality of gate electrodes;

determining an implant parameter value for each of a plurality of implant zones based on the measured physical characteristic; and implanting a dopant into each of the implant zones using the corresponding implant parameter value.

23. The method of claim 22, wherein implanting a dopant into a first implant zone of the plurality of implant zones uses a different implant parameter value than implanting a dopant into a second implant zone of the plurality of implant zones.

24. The method of claim 22, wherein the implant parameter value is a halo implant dose.

25. The method of claim 22, wherein the implant parameter value is a lightly doped drain (LDD) implant dose.

* * * * *